(12) United States Patent
Chang et al.

(10) Patent No.: US 7,875,477 B2
(45) Date of Patent: Jan. 25, 2011

(54) MANUFACTURING METHOD OF LIQUID CRYSTAL DISPLAY

(75) Inventors: Jae-hyuk Chang, Gyeonggi-do (KR); Nam-seok Roh, Gyeonggi-do (KR); Mun-pyo Hong, Gyeonggi-do (KR); Dae-jin Park, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 393 days.

(21) Appl. No.: 11/490,280

(22) Filed: Jul. 19, 2006

(65) Prior Publication Data

US 2008/0286889 A1 Nov. 20, 2008

(30) Foreign Application Priority Data

Jul. 19, 2005 (KR) .................. 10-2005-0065456

(51) Int. Cl.
*H01L 21/00* (2006.01)
(52) U.S. Cl. .................. 438/34; 257/E21.492; 438/28; 438/29; 438/35; 438/99
(58) Field of Classification Search .................. 438/29, 438/30, 31, 32, 28, 34, 35, 99; 349/95–113, 349/114, 47, 160; 430/327; 257/E21.492
See application file for complete search history.

(56) References Cited

U.S. PATENT DOCUMENTS

| | | | | |
|---|---|---|---|---|
| 6,452,653 | B1* | 9/2002 | Yamanaka et al. | 349/113 |
| 7,106,400 | B1* | 9/2006 | Tsuda et al. | 349/113 |
| 7,259,110 | B2* | 8/2007 | Ohnuma et al. | 438/782 |
| 7,295,256 | B2* | 11/2007 | Kim | 349/43 |
| 2002/0127499 | A1* | 9/2002 | Endo et al. | 430/327 |
| 2003/0071944 | A1* | 4/2003 | Baek | 349/113 |
| 2003/0207484 | A1* | 11/2003 | Nishikawa | 438/31 |
| 2004/0115846 | A1* | 6/2004 | Otake et al. | 438/22 |
| 2004/0144754 | A1* | 7/2004 | Itami et al. | 216/62 |
| 2004/0167310 | A1* | 8/2004 | Suehiro et al. | 528/44 |
| 2005/0150589 | A1* | 7/2005 | Amos et al. | 156/209 |
| 2005/0266693 | A1* | 12/2005 | Maekawa | 438/720 |

(Continued)

FOREIGN PATENT DOCUMENTS

CN 1191327 8/1998

(Continued)

OTHER PUBLICATIONS

English Language Abstract, KR Patent First Publication No. 2005-0037773, Apr. 25, 2005, 1 page.

(Continued)

*Primary Examiner*—Asok K Sarkar
(74) *Attorney, Agent, or Firm*—Innovation Counsel LLP

(57) ABSTRACT

A method of manufacturing a liquid crystal display at a reduced cost is presented. The method entails: preparing an insulating substrate; forming a gate line and a data line on the insulating substrate to define a pixel area; forming a thin film transistor at an intersection of the gate line and the data line; forming A passivation layer on the thin film transistor; positioning a mold having a concavo-convex pattern on the organic passivation layer, pressing the mold, and forming the concavo-convex pattern on the surface of the organic passivation layer. A pixel electrode on the organic passivation layer is formed.

17 Claims, 16 Drawing Sheets

U.S. PATENT DOCUMENTS

| | | | |
|---|---|---|---|
| 2005/0282402 A1* | 12/2005 | Kim | 438/780 |
| 2006/0007102 A1* | 1/2006 | Yasuoka et al. | 345/102 |
| 2006/0215082 A1* | 9/2006 | Nakano | 349/113 |
| 2007/0152372 A1* | 7/2007 | Chae et al. | 264/320 |

FOREIGN PATENT DOCUMENTS

| | | |
|---|---|---|
| CN | 1591047 | 3/2005 |
| JP | 2000-214455 | 8/2000 |
| JP | 2001-75090 | 3/2001 |
| JP | 2001-260219 | 9/2001 |
| JP | 2002-90729 | 3/2002 |
| JP | 2002-268057 | 9/2002 |
| JP | 2003-43465 | 2/2003 |
| JP | 2003-177396 | 6/2003 |
| JP | 2004-117695 | 4/2004 |
| JP | 2004-280113 | 10/2004 |
| JP | 2005-157104 | 6/2005 |
| JP | 2005-157218 | 6/2005 |
| JP | 2005-157219 | 6/2005 |
| KR | 1020030058153 | 7/2003 |
| KR | 1020050024177 | 3/2005 |
| KR | 2005-0037773 | 4/2005 |

OTHER PUBLICATIONS

English Language Abstract, KR Patent First Publication No. 1020050024177, Mar. 10, 2005, 1 page.

English Language Abstract, KR Patent First Publication No. 1020030058153, Jul. 7, 2003, 1 page.

* cited by examiner

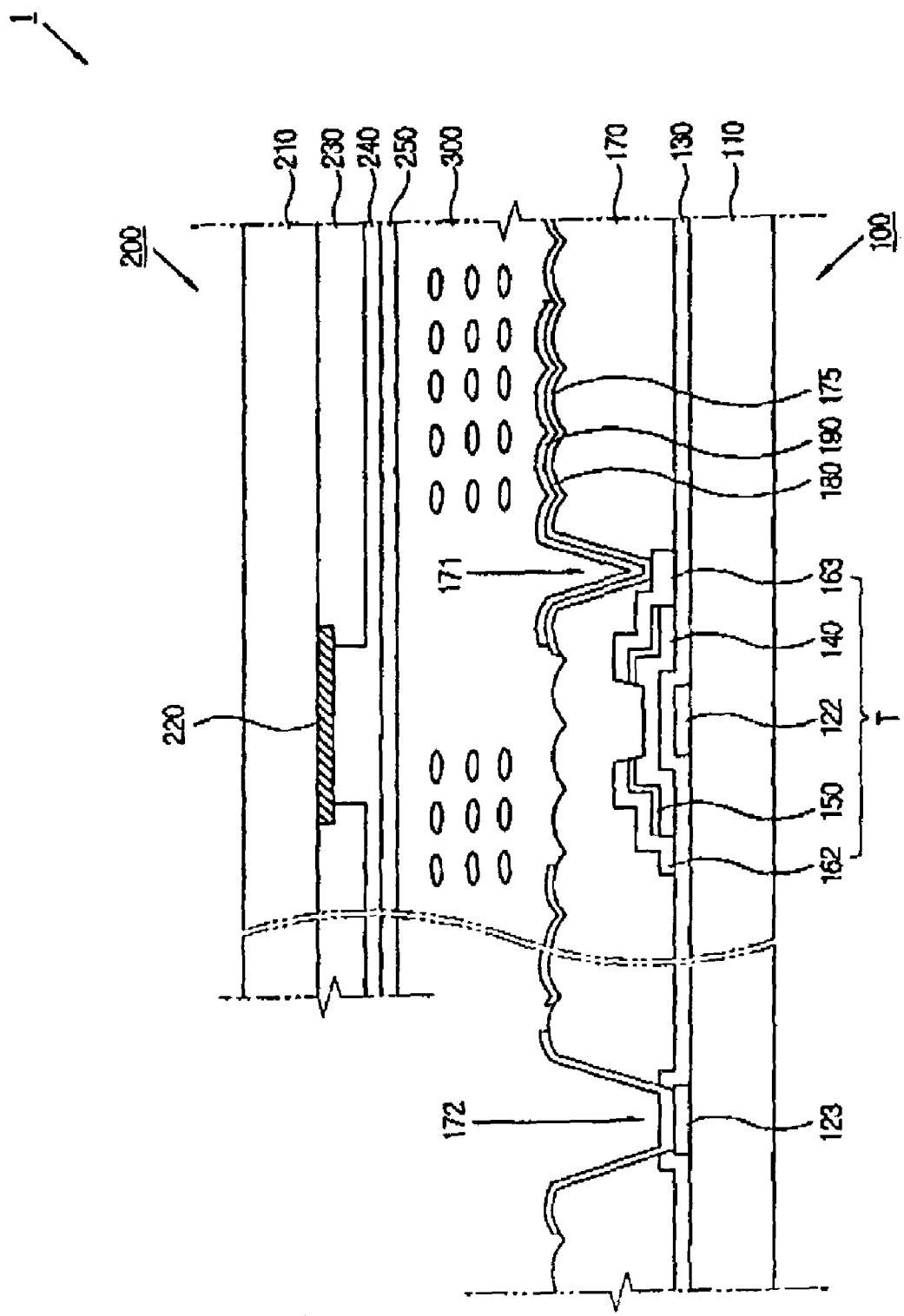

MANUFACTURING METHOD OF LIQUID CRYSTAL DISPLAY

CROSS-REFERENCE TO RELATED APPLICATIONS

This application claims priority from Korean Patent Application No. 2005-006456 filed on Jul. 19, 2005 in the Korean Intellectual Property Office, the disclosure of which is incorporated herein by reference.

BACKGROUND OF INVENTION

1. Field of Invention

The present invention relates to a manufacturing a transflective display device.

2. Description of the Related Art

Recently, display devices such as the liquid crystal display (LCD) device, plasma display panel (PDP), organic light emitting diode (OLED), and electro phoretic indication display, among others, have been gradually replacing the cathode ray tube (CRT) in various display applications.

A liquid crystal display includes a thin film transistor substrate on which thin film transistors are formed, color filter substrate on which color filters are formed, and a liquid crystal panel having liquid crystal layers inserted between the thin film transistor substrate and the color filter substrate. Since the liquid crystal panel is a non-light-emitting element, a backlight unit is often mounted on a rear surface of the thin film transistor substrate to supply light. The amount of light emitted by the backlight unit that is transmitted through the liquid crystal layer is adjusted according to the arrangement state of the liquid crystal molecules in the layer. By controlling the light transmission, a desired image is displayed on the liquid crystal panel.

The liquid crystal display can be classified into transmission type, reflective type, and transflective type according to the types of used light sources. The transmission-type liquid crystal display allows light (e.g., light from a backlight unit) to pass through the liquid crystal panel, thereby displaying images of a consistently high quality regardless of the amount of light available in the environment. The reflective-type liquid crystal display, in which reflective layers are formed on the entire surface of pixel electrodes, utilizes light in the environment to display images. An advantage of the reflective-type liquid crystal display is that it does not rely on the backlight unit as the sole source of light, thus consuming only about 30% of the amount of power that is consumed by the transmission-type liquid crystal display. A reflective-type liquid crystal display includes reflective layers that reflect the light from the environment and uses the reflected light to display images.

The transflective-type liquid crystal display combines the transmission-type liquid crystal display's ability to consistently produce high-quality images with the reflective-type liquid crystal display's ability to operate at low power consumption. The transflective-type liquid crystal display can implement high picture quality, is small in size, light in weight, and has low power consumption requirement. Particularly, the transflective-type liquid crystal display uses the light in the environment and a backlight unit to ensure a proper brightness level regardless of changes in the environment. Advantageously, this ability to modulate the brightness not only ensures that the images will be adequately bright but also makes adjustments according to lighting conditions. For example, a transflective-type liquid crystal display allows users to view still and moving images as well as character information even under direct sunlight.

When the thin film transistor substrate of the transflective liquid crystal display is manufactured, an organic passivation layer is applied to substantially the entire surface of a mother substrate, concavo-convex pattern is formed using a slit mask in the surface of the organic passivation layer formed on insulating substrate to be used as the thin film transistor substrate, and then pixel electrodes and reflective layers are sequentially formed. The concavo-convex pattern is used to induce diffused reflection and light scattering of the reflective layers.

The concavo-convex pattern may be formed by a half exposure method or a planarization method. The half exposure method entails performing a photolithography process multiple times to form the concavo-convex patterns, contact holes, etc., and thus requires long manufacturing time and high manufacturing cost. As for methods using the slit mask, they cannot induce appropriate diffused reflection and scattering since the yield and reflection efficiency of the concavo-convex patterns are low.

A method of forming the concavo-convex pattern in the thin film transistor substrate without the above problems is desired.

SUMMARY OF THE INVENTION

Accordingly, it is an aspect of the present invention to provide a method for manufacturing a display device that is capable of enhancing the yield and reflection efficiency of concavo-convex patterns and simplifying manufacturing processes.

Additional features of the invention will be set forth in the description which follows, and in part will be apparent from the description, or may be learned by practice of the invention.

In one aspect, the invention is a method of manufacturing a display device. The method entails: preparing an insulating substrate; forming a gate line and a data line on the insulating substrate, the gate line and the data line extending in directions that are perpendicular to each other while remaining insulated from each other, the gate line and the data line define a pixel area forming a thin film transistor at an intersection of the gate line and the data line; forming an organic passivation layer on the thin film transistor; positioning a mold having a concavo-convex pattern such that the concavo-convex pattern is aligned with the pixel area on the organic passivation layer; pressing the mold, and forming the concavo-convex pattern on the surface of the organic passivation layer; and forming a pixel electrode on the organic passivation layer.

BRIEF DESCRIPTION OF THE DRAWINGS

The above and/or other aspects and advantages of the present invention will become apparent and more readily appreciated from the following description of the exemplary embodiments, taken in conjunction with the accompanying drawings, in which:

FIG. 3 is a cross-sectional view cut along the dotted line III-III of FIG. 2;

DETAILED DESCRIPTION OF THE EMBODIMENTS

Figure 1:
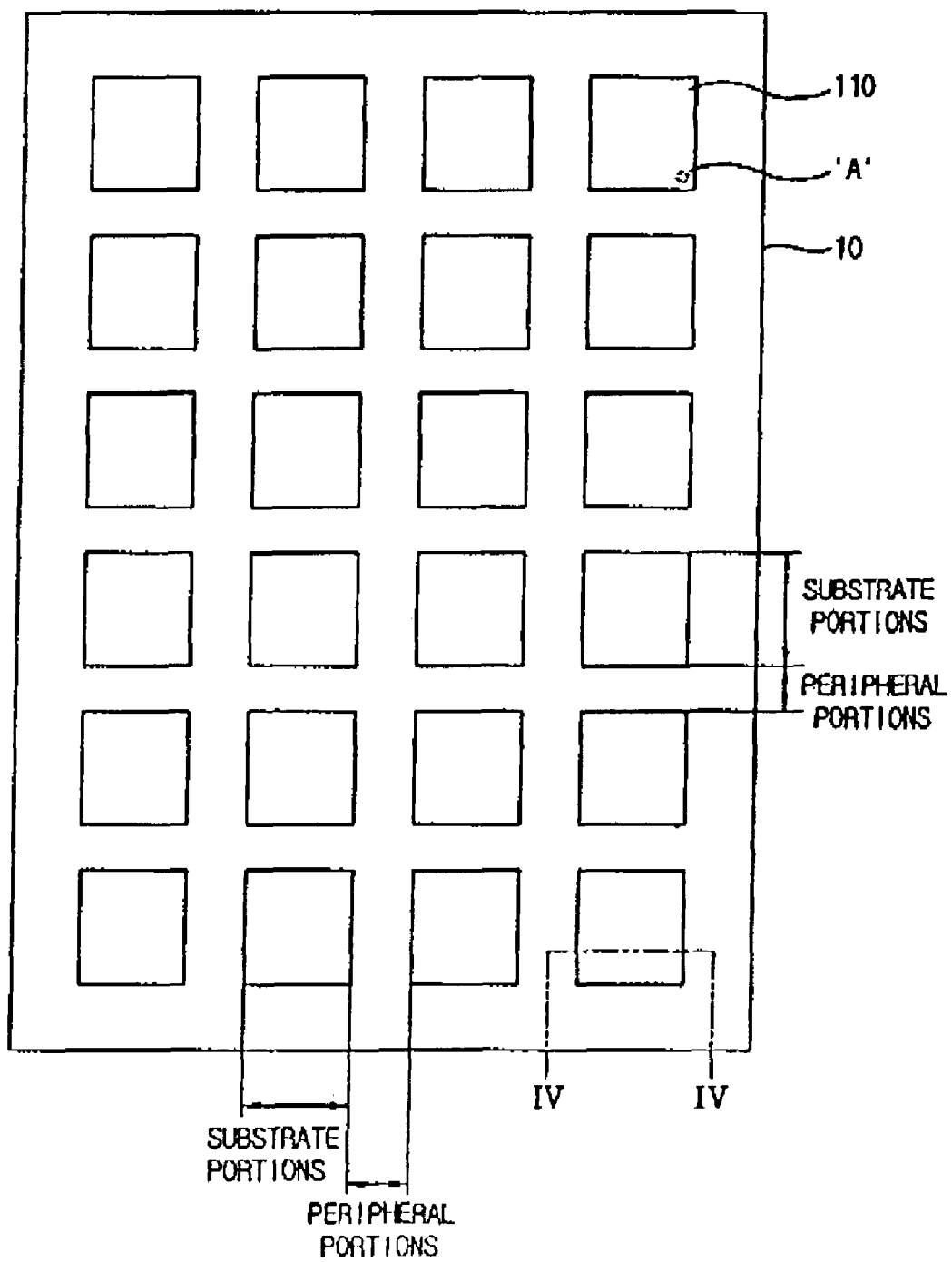
FIG. 1 is a plane view illustrating a mother substrate substance according to a first embodiment of the present invention.

Reference will now be made in detail to the embodiments of the present invention, examples of which are illustrated in the accompanying drawings, wherein like reference numerals refer to like elements throughout. The embodiments are described below to explain the present invention in reference to the figures.

It will be understood that when a layer is referred to as being "on" another layer or substrate, it can be directly on the other layer or substance, or intervening layers may also be present.

Figure 2:
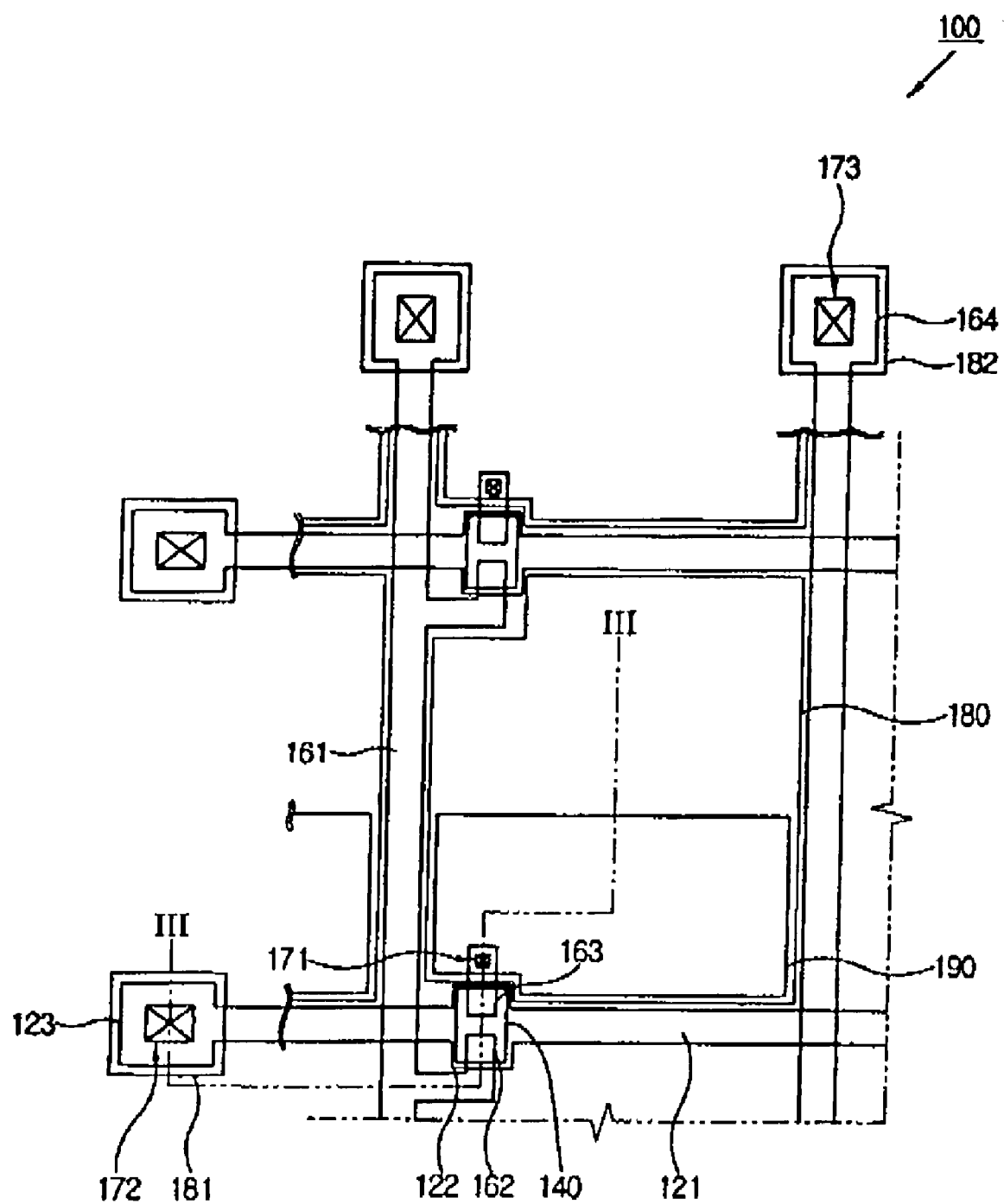
FIG. 2 is a layout of the area 'A' marked in FIG. 1.

FIG. 1 is a plan view illustrating a mother substrate substance according to a first embodiment of the present invention, FIG. 2 is a layout of the area 'A' marked in FIG. 1, and FIG. 3 is a cross-sectional view cut along the dotted line III-III of FIG. 2.

Referring to FIGS. 1, 2 and 3, a liquid crystal panel 1 according to a first embodiment of the present invention includes a thin film transistor substrate (first substrate) 100, color filter substrate (second substrate) 200, and a liquid crystal layer 300 positioned between the first substrate 100 and the second substrate 200.

First, the thin film transistor substrate 100 will be described below.

As shown in FIG. 1, a plurality of first substrates 100 are manufactured from a large mother substrate substance 10 by a well-known thin film transistor substrate manufacturing process. Although FIG. 1 illustrates that 24 insulating substrates 110 can be made from the mother substrate substance 10, this is an example and not meant to be limiting. An organic passivation layer formed on areas (hereinafter, referred to as peripheral areas) between insulating substrates 110 will be removed during the following exposure and developing processes.

FIG. 2 is an expanded diagram of the area 'A' marked in FIG. 1. Referring to FIGS. 2 and 3, a gate line 121, a gate electrode 122, and a gate pad 123, herein collectively referred to as "gate wires," are formed on the first insulating substrate 110. The gate wires can be formed as a single metal layer or a plurality of metal layers. The gate line 121 extends in a first direction, the gate electrode 122 is connected to the gate line 121, and the gate pad 123 is connected to a gate driver (not shown) for receiving a driving signal.

A gate insulating film 130 made of a silicon nitride $SiN_x$, etc. is deposited over the first insulating substrate 110 and the gate wires.

A semiconductor layer 140 made of a semiconductor, such as amorphous silicon, etc., is formed on the gate insulating film 130 in the region on and around the gate electrode 122. An ohmic contact layer 150 made of a material such as n+ hydride amorphous silicon, etc., in which silicide or n-type impurities is doped with a high concentration, is formed on the semiconductor layer 140. There is no ohmic contact layer 150 on the channel area between a source electrode 162 and a drain electrode 163.

A data line 161, a source electrode 162, and a drain electrode 163, herein collectively referred to as "data wires", are formed on the resistor contact layer 150 and the gate insulating film 130. The data wires can be formed as a single layer or a plurality of layers, wherein at least one of the layers is made of a metal. The data line 161 extends in a direction that is perpendicular to the gate line 121 while remaining electrically insulated from the gate line 121. The data line 161 and the gate line 121 define pixels. The source electrode 162 extends from the data line 161 and covers the ohmic contact layer 150. The drain electrode 163 is separated from the source electrode 162 and covers the ohmic contact layer 150 across the gate electrode 122 from the source electrode 162.

An organic passivation layer 170 is formed on the data wires and the exposed surfaces of the semiconductor layer 140. A concavo-convex pattern 175, a drain contact hole 171 for exposing the drain electrode 163, and a gate pad contact hole 172 are formed on the organic passivation layer 170. Also formed on the organic passivation layer 170 are a data pad contact hole 173 connected to a gate driver (not shown) and a data driver (not shown) for applying driving signals to the gate line 121 and the data line 161. The concavo-convex pattern 175 formed in the surface of the organic passivation layer 170 induces light scattering and thus enhances reflectivity. In order to enhance the reliability of a thin film transistor T, an inorganic insulating film (not shown) such as a silicon nitride can be additionally formed between the organic passivation layer 170 and the thin film transistor T. Here, the organic passivation layer 170 may be a highly viscous organic layer whose shape can be maintained. The organic passivation layer 170 has a viscosity of 10,000 cp or more.

A pixel electrode 180 is formed on the upper surface of the organic passivation layer 170 in which the concavo-convex pattern 175 is formed. The pixel electrode 180 is made of a transparent conductive material such as an indium tin oxide (ITO) or an indium zinc oxide (IZO). The pixel electrode 180 is electrically connected to the drain electrode 163 through the drain contact hole 171. Then, secondary contact members 181 and 182 are formed on the gate pad contact hole 172 and the data pad contact hole 173. The secondary contact members 181 and 182 are generally made of a transparent conductive material, such as ITO or IZO. A concavo-convex pattern is automatically formed on the surface of the pixel electrode 180, which is formed to have a substantially constant thickness on the concavo-convex pattern 175.

A reflective layer 190 is formed on the pixel electrode 180. A pixel area defined by the gate line 121 and the data line 161 is divided into a transmission area on which no reflective layer 190 is formed and a reflective area on which the reflective layer 190 is formed. In the transmission area, light emitted from a backlight unit (not shown) is transmitted and exits the liquid crystal panel 1. In the reflective area on which the reflective layer 190 is formed, the light incident from the outside is reflected before exiting the liquid crystal panel 1. The reflective layer 190 is made primarily of aluminium or silver. Alternatively, the reflective layer 190 may be formed as a double-layer structure of aluminium and molybdenum. As described above, the reflective layer 190 is formed on the pixel electrode 180. Then, a concavo-convex pattern is formed on the surface of the reflective layer 190 because of the concavo-convex pattern formed on the surface of the pixel electrode 180.

Now, the color filter substrate 200 will be described.

A black matrix 220 is formed on a second insulating substrate 210. The second insulating substrate 210 may be prepared from the mother substrate substance 10 similarly to the first insulating substrate 110. The black matrix 220 is generally used to separate red, green and blue filters from each other and prevent light from being directly emitted to the thin film transistor T positioned on the first substrate 100. The black matrix 220 is generally made of a photosensitive organic material containing a black pigment. The black pigment may be carbon black or titanium oxide, etc.

Then, color filters 230 (230 for each) are arranged in such a manner that red, green and blue filters are repeatedly formed between black matrices 220. Each color filter 230 acts to impart a color to the white light that is emitted by the backlight unit (not shown) has after it passed through the liquid crystal layer 300. The color filter 230 is generally formed with a photosensitive organic material.

An overcoat layer 240 is formed on the color filter 230 and the exposed surface of the black matrix 220 on which no color filter 230 exists. The overcoat layer 240 protects the color filter 230 and planarizes a surface of the color filter 230. The overcoat layer is mainly formed with an acrylic epoxy material.

Then, a common electrode 250 is formed on the entire surface of the overcoat layer 240. The common electrode 250 is made of a transparent conductive material such as ITO or IZO. The common electrode 250 and the pixel electrode 180 of the thin film transistor substrate 100 directly apply a voltage to the liquid crystal layer 300.

Then, the liquid crystal layer 300 is injected between the thin film transistor substrate 100 and the color filter substrate 200, and the substrates 100 and 200 are coupled by a sealant (not shown).

Hereinafter, a method for manufacturing a liquid crystal display according to a first embodiment of the present invention will be described. Specifically, a method for manufacturing a thin film transistor substrate is described.

FIGS. 4A through 4E are cross-sectional views of the insulating substrate 110 cut along the line IV-IV of FIG. 1. The process for forming a concavo-convex pattern 175 in an organic passivation layer 170 of a first substrate 100 will be described in reference to FIGS. 4A through 4E.

First, as shown in FIGS. 2 and 3, after a gate wire material is deposited on a first insulating substrate 110, patterning is performed by a photolithographic process using a mask. The photolithographic process produces the gate line 121, the gate electrode 122, the gate pad 123, etc. Then, a gate insulating film 130, a semiconductor layer 140, and a resistor contact layer 150 are sequentially applied.

Thereafter, by performing a photolithographic process on the semiconductor layer 140 and the resistor contact layer 150, a resultant semiconductor layer 140 is formed on the gate insulating film 130 over the gate electrode 122. The resistor contact layer 150 is formed on the semiconductor layer 140.

Then, after a data wire material is applied, patterning is performed by a photolithographic process using a mask so that the data line 161, the source electrode 162, and the drain electrode 163 are formed. The exposed surface of the ohmic contact layer 150 is etched, so that the ohmic contact layer 150 is divided into two parts with the gate electrode 122 in between the two parts. The etching of the ohmic contact layer 150 exposes a part of the semiconductor layer 140. During this etching process, the portion of the ohmic contact layer 150 that is above the gate electrode 122 is almost completely removed and the portion of the semiconductor layer 140 that is above the gate electrode 122 is partially etched to leave a thinner layer than before. To stabilize the surface of the exposed semiconductor layer 140, the etching is preferably carried out using oxygen plasma.

Then, an organic passivation layer 170 is formed using a spin coating method or a slit coating method, although other methods may be suitable as well. To enhance the reliability of the thin film transistor T, an inorganic insulating layer, such as a silicon nitride, can be additionally formed between the organic passivation layer 170 and the thin film transistor T. Here, the organic passivation layer 170 may be a highly viscous organic layer whose shape can be maintained. The organic passivation layer 170 has a viscosity of 10,000 cp or more.

Figure 4A:
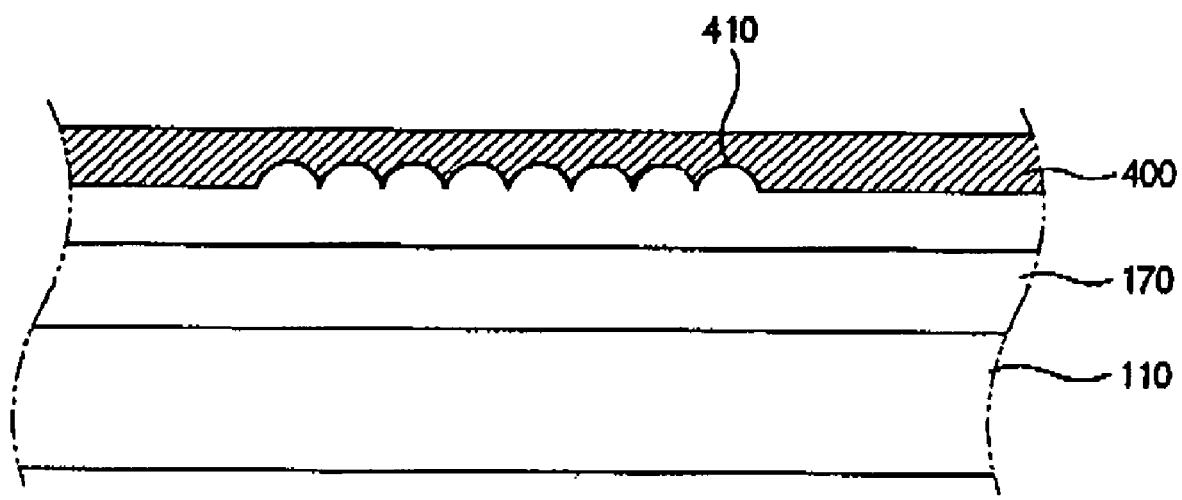
FIGS. 4A through 4E are cross-sectional views cut along the line IV-IV of FIG. 1, for explaining a process of manufacturing a thin film transistor substrate.
Figure 4B:
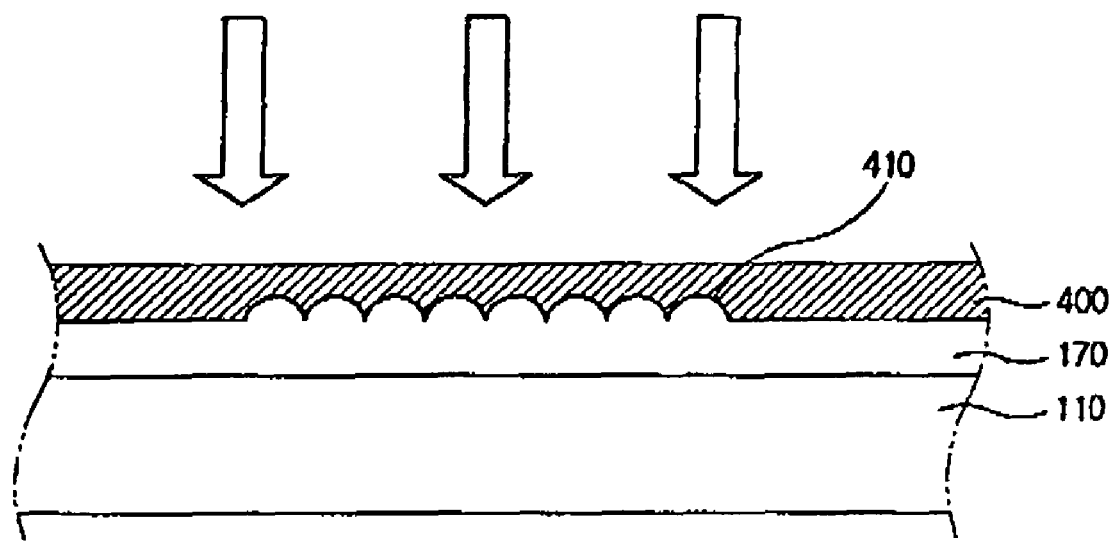

FIG. 4A shows a mold 400 having a concavo-convex pattern 410 positioned over the organic passivation layer 170. The concavo-convex pattern 410 is aligned and positioned on the organic passivation layer 170 so that the concavo-convex pattern will be formed on the organic passivation layer 170 in the pixel area. Then, as shown in FIG. 4B, the mold 400 is placed in contact with and pressed against the organic passivation layer 170 (in the direction indicated by the arrows). As a result of this pressing, a concavo-convex pattern 175 is formed on the surface of the organic passivation layer 170.

Figure 4C:
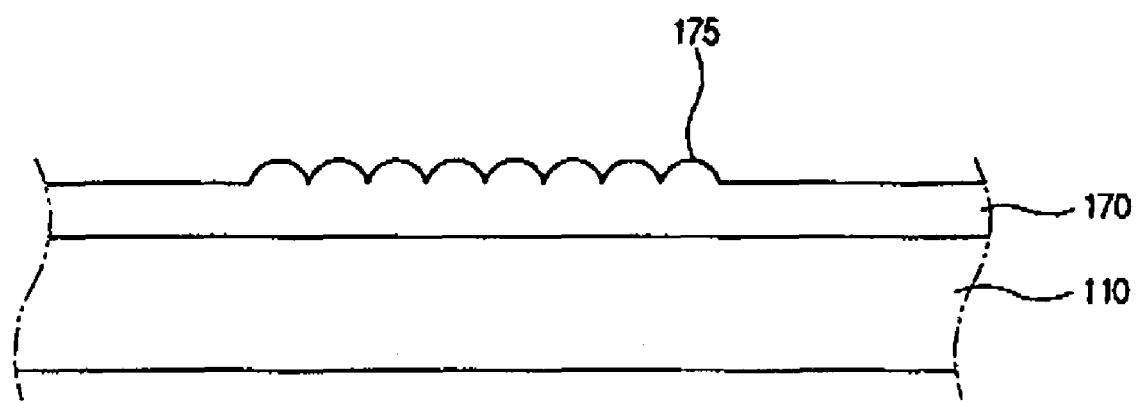

Thereafter, as shown in FIG. 4C, the mold 400 is removed. Since the organic passivation layer 170 is a highly viscous organic layer, the shape of the concavo-convex pattern 175 is maintained when the mold 400 is removed. At this time, a release agent may be applied to the surface of the mold 400 to facilitate the removal of the mold 400.

Figure 4D:
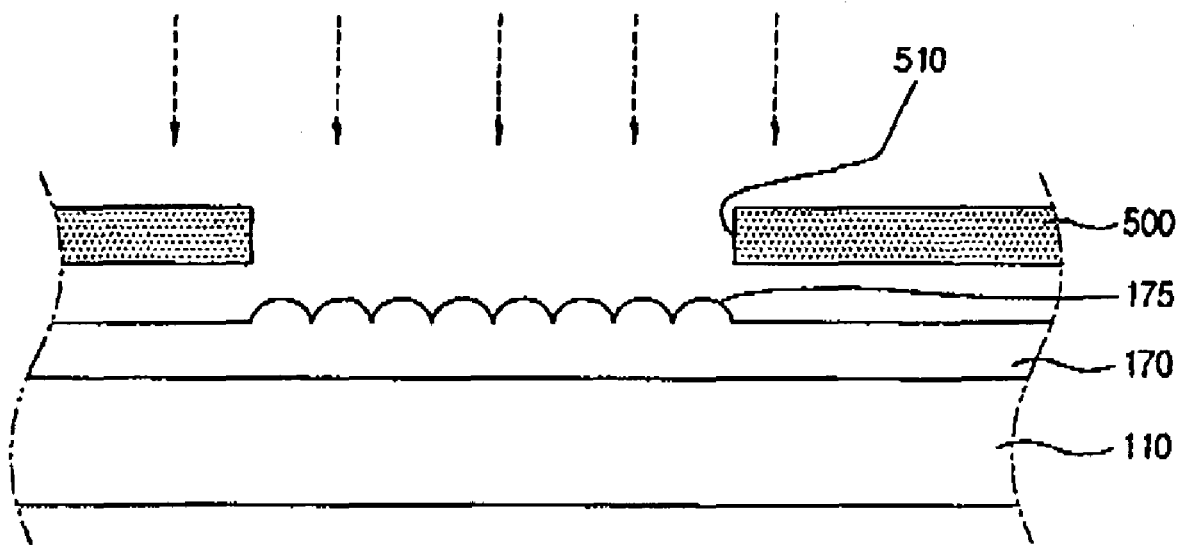
Figure 4E:
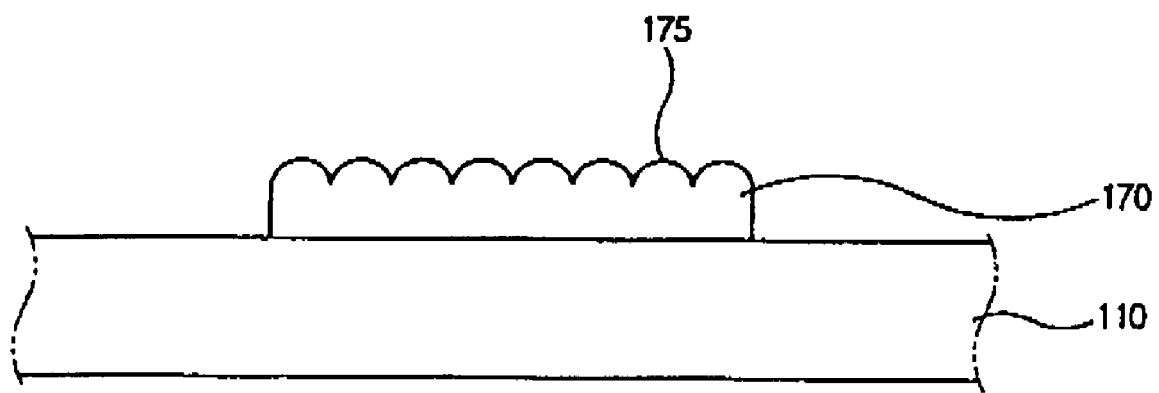

After the mold 400 is removed, as shown in FIG. 4D, a mask 500 having an opening to expose the concavo-convex pattern 175 is aligned with the concavo-convex pattern 175, and irradiated with ultraviolet ray. Then, as shown in FIG. 4E, a developing process is performed to remove the parts of the organic passivation layer 170 where no concavo-convex pattern 175 is formed. The portion of the organic passivation layer 170 that is removed corresponds to the peripheral areas. During the developing process, drain contact holes 171, gate pad contact holes 172 and data pad contact holes 173 may be formed at the same time the peripheral organic passivation layer 170 is removed.

Meanwhile, in the current embodiment, the organic passivation layer 170 having the concavo-convex pattern 175 is formed using a photosensitive organic material which is removed when not cured by ultraviolet radiation. However, in other cases, the organic passivation layer 170 having the concavo-convex pattern 175 may be formed using a photosensitive organic material that is removed by exposure to the ultraviolet radiation. In this latter case, the opening in the mask 500 is shifted so that the opening is positioned above the part of the organic passivation layer area 170 to be removed.

After the concavo-convex pattern 175 is prepared, ITO or IZO is applied to the organic passivation layer 170 and the photolithographically patterned to form a pixel electrode 180. The pixel electrode 180 is connected to the drain electrode 163 through the drain contact hole 171. The pixel electrode 180 has a concavo-convex pattern due to the concavo-convex pattern 175 in a lower part. Then, secondary contact members 181 and 182 which are respectively connected to the gate pad 123 and a data pad 164 through the gate pad contact hole 172 and the data pad contact hole 173 are respectively formed.

After the pixel electrode 180 is formed, a reflective material is formed on the pixel electrode 180 and patterned to form a reflective layer 190 on at least one part of the pixel electrode 180. The reflective layer 190 can be composed of silver, chrome, a silver-chrome alloy, or a double layer of aluminium and molybdenum. The reflective layer 190 is formed in areas (reflective areas) that are not transmission areas. Due to the concavo-convex pattern 175 described above, the reflective layer 190 also has the concavo-convex pattern. The reflective layer 190 receives electrical signals from the pixel electrode 180 and applies the received signals to the liquid crystal layer 300 positioned on the reflective layer 190.

Thereafter, an alignment film (not shown) is formed and thus a thin film transistor substrate 100 according to a first embodiment of the present invention is prepared.

The black matrix 220, the color filter 230, the overcoat layer 240, a common electrode 250 and an alignment film are formed on a second insulating substrate 210 by a well-known method, thereby making the second substrate 200. Finally, by coupling the first substrate 100 to the second substrate 200 and injecting liquid crystal therebetween, a liquid crystal panel 1 is prepared.

According to the above-described method, the concavo-convex pattern 175 is formed by using the mold 400 without using a slit mask. Thus, one fewer photolithography process is needed compared to the conventional half exposure method and planarization method.

If the concavo-convex pattern 175 were formed by using a slit mask, the concavo-convex pattern 175 likely will not cause appropriate light scattering because the yield and reflection efficiency of the formed concavo-convex pattern 175 are low with the slit mask. Excessive scattering causes the image to become dark because it allows the color filter substrate 200 and a deflection plate to absorb a large amount of light. Conversely, insufficient scattering causes problems in a viewing angle because light is concentrated in a specific direction. Furthermore, since the liquid crystal panel 1 has a multi-layer structure with different refraction indexes, light that is reflected at an angle greater than a threshold angle may not be able to exit the liquid crystal panel 1.

However, in the manufacturing method according to the present invention, since the concavo-convex pattern 175 is formed using the high-quality mold 400, the yield and reflection efficiency of the concavo-convex pattern 175 are enhanced. Thus, the concavo-convex pattern formed with the method described herein produces appropriate diffused reflection and scattering. In addition, the manufacturing process of the invention is simpler than the conventional manufacturing method that involves multiple photolithographic process steps.

Hereinafter, a second embodiment of the present invention will be described with reference to FIGS. 5A, 5B and 5C. Descriptions for the same processes as in the first embodiment will be omitted and difference from the first embodiment will be described.

Figure 5A:
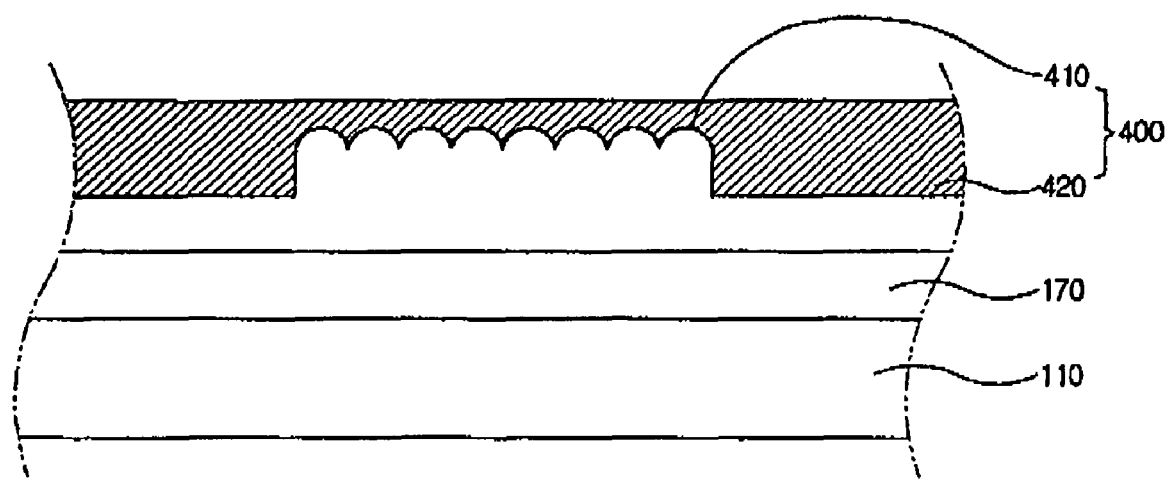
FIGS. 5A, 5B and 5C are cross-sectional views for explaining a process of manufacturing a thin film transistor substrate, according to a second embodiment of the present invention.
Figure 5B:
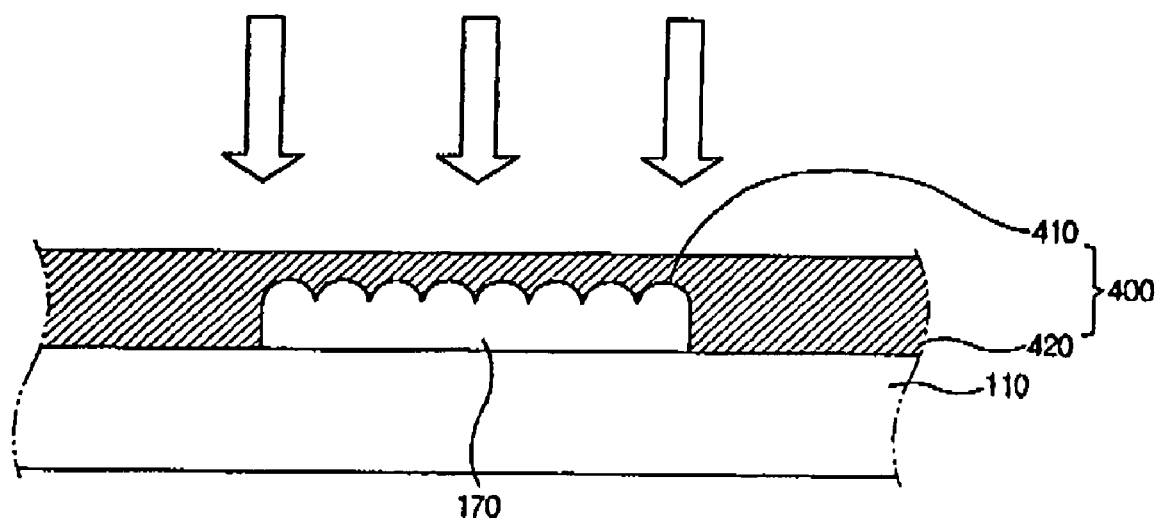
Figure 5C:
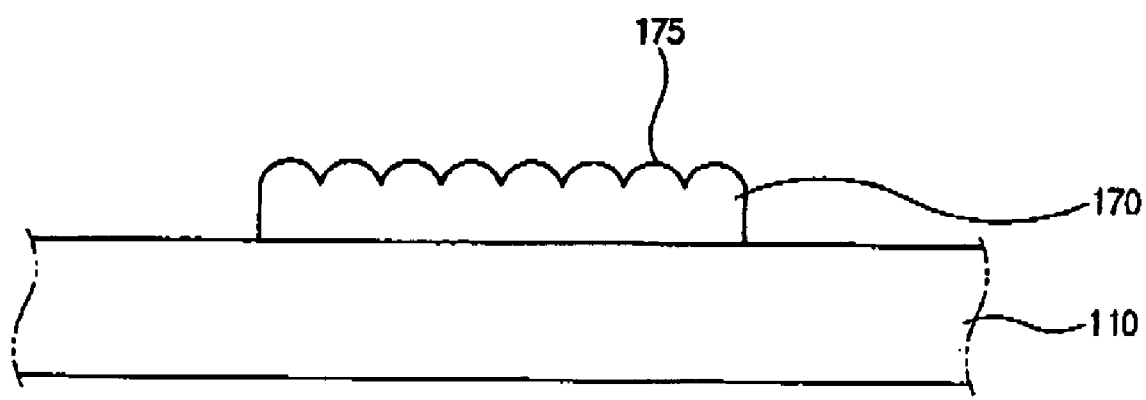

FIGS. 5A through 5C are schematic views for explaining a method of forming a concavo-convex pattern 175 in an organic passivation layer 170 of a first substrate 100.

Referring to FIG. 1, the insulating substrates 110 that are used as thin film transistor substrate 100 are manufactured from a large mother substrate substance 10. The mother substrate substance 10 has multiple substrate areas that will become the insulating substrates 110. Peripheral areas, which are parts of the mother substrate substance 10 that will not be formed into insulating substrates 110, separate the insulating substrates 110.

As shown in FIG. 5A, an organic passivation layer 170 is formed on a first insulating substrate 110. Here, the organic passivation layer 170 is a small molecule organic layer, different from the first embodiment. The organic passivation layer 170 has a viscosity of 1 cp to 100 cp.

The small-molecule organic layer is hardened by ultraviolet radiation or heat treatment. In the second embodiment, the mold 400 has a concavo-convex pattern 410 in the areas that will be aligned with a pixel area or a substrate area. In addition, the mold 400 has a protection film removing portion 420 positioned to align with the peripheral area of the mother substrate substance 10. The protection film removing portion 420 is pressed toward the organic passivation layer 170. Preferably, as shown in FIG. 5B, the protection film removing portion 420 is formed with a predetermined height so that it comes in contact with the insulating substrate 110 when the mold 400 is pressurized in the direction shown by the arrows. Here, in order to harden the organic passivation layer 170 while maintaining the concavo-convex pattern 175, the mold 400 is preferably made of a transparent material that can transmit ultraviolet radiation. The transparent material used for forming the mold 400 may be polydimethylsilixane (PDMS) Unlike in the process of FIG. 4D, no mask is utilized in this method.

Then, as shown in FIG. 5B, by pressuring the mold 400, the organic passivation layer 170 is positioned in the area between the insulating substrates 110, i.e., in the peripheral area. The organic passivation layer 170 is removed by the protection film removing portion 420, and the concavo-convex pattern 175 is formed by the concavo-convex pattern 410 of the mold 400. Ultraviolet radiation is used to harden the concavo-convex pattern 175 after it is formed by the mold 400. Then, the mold 400 is removed as shown in FIG. 5C, thereby completing a resultant high-quality concavo-convex pattern 175.

Although not shown in the drawings, the organic passivation layer 170 that is not removed by the protection film removing portion 420 can remain on the insulating substrate 110. In this case, the remaining organic passivation layer 170 can be removed through a separate ashing process.

Therefore, in the manufacturing method according to the present invention, since the concavo-convex pattern 175 is formed using the high-quality mold 400 and hardening is carried out. In the state where the concavo-convex pattern 175 is formed, the yield and reflection efficiency of the concavo-convex pattern 175 can be enhanced and appropriately diffused reflection and scattering can be induced. Furthermore, since the concavo-convex pattern 175 is formed using the mold 400, the manufacturing process can be simplified compared to the conventional method utilizing a slit mask. Particularly, since exposure and developing processes can be omitted, manufacturing method can be simplified and manufacturing costs can be reduced.

Hereinafter, a third embodiment of the present invention will be described with reference to FIGS. 6A through 6E, wherein descriptions for the same processes as in the first embodiment will be omitted and difference from the first embodiment will be described.

FIGS. 6A through 6E are schematic views for explaining a method of forming the concavo-convex pattern 175 in the organic passivation layer 170 of the first substrate 100.

Figure 6A:
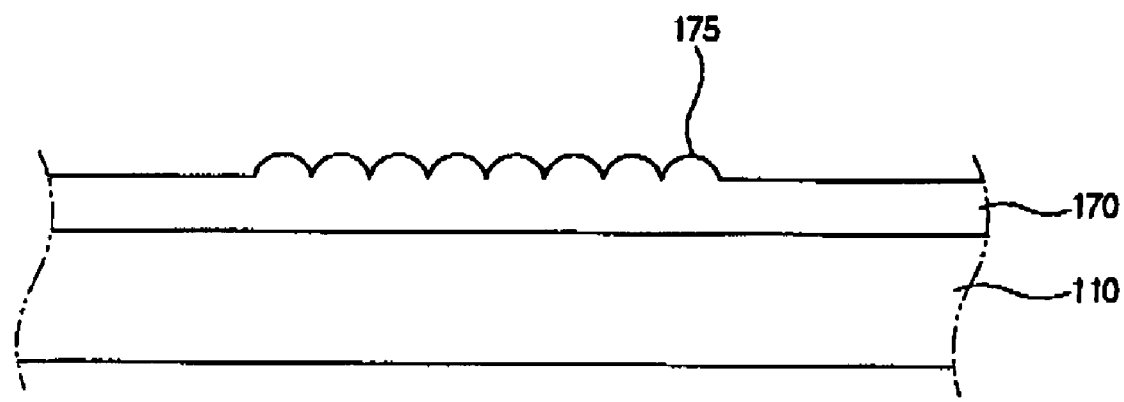
FIGS. 6A through 6E are cross-sectional views for explaining a process of manufacturing a thin film transistor substrate, according to a third embodiment of the present invention.

As shown in FIG. 6A, the concavo-convex pattern 175 is formed on the surface of the organic passivation layer 170 on a first insulating substrate 110, similarly to the first embodiment. In case where the organic passivation layer 170 is an organic layer having low viscosity, the concavo-convex pattern 175 can be formed through molding and hardening.

Figure 6B:
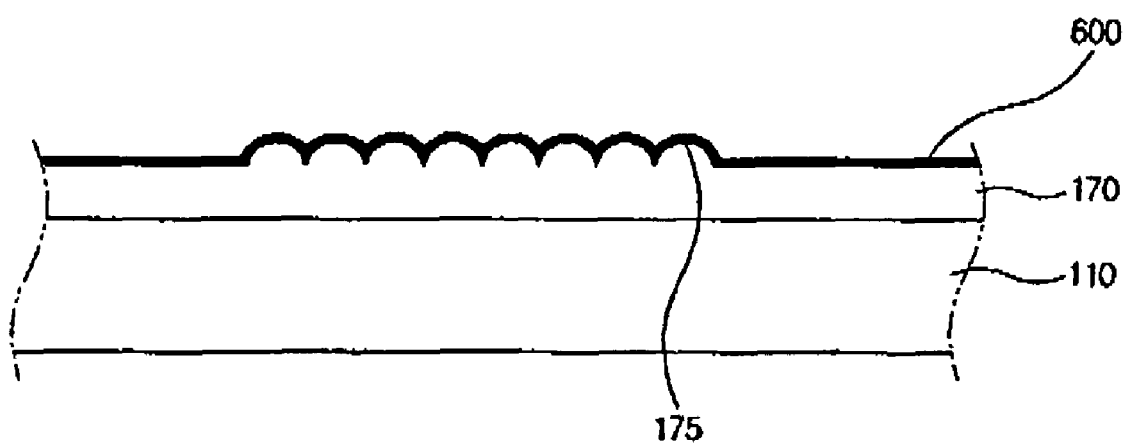
Figure 6C:
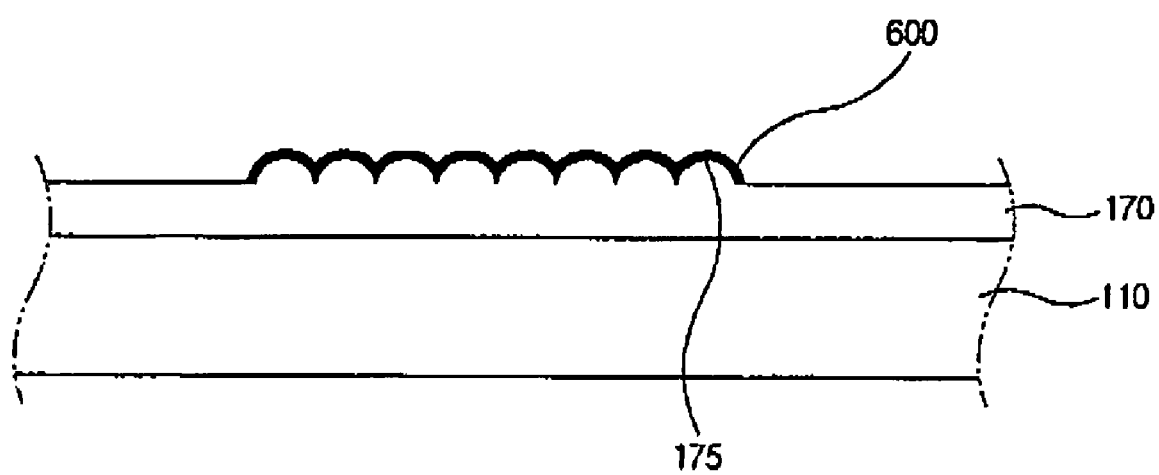

Thereafter, as shown in FIG. 6B, a photosensitive layer 600 can be formed on the entire surface of the organic passivation layer 170 with the concavo-convex pattern 175. Then, as shown in FIG. 6C, exposure and developing processes are performed using a mask (not shown) and thus the photosensitive layers 600 formed on peripheral areas without the concavo-convex pattern 175 are removed.

Figure 6D:
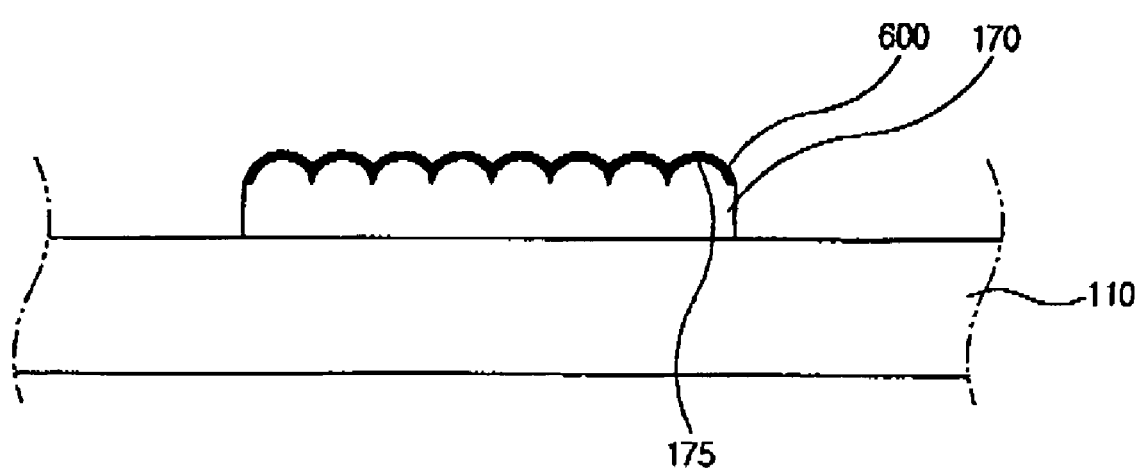

Successively, as shown in FIG. 6D, the organic passivation layers 170 of the peripheral areas without the concavo-convex pattern 175, are removed using the photosensitive layer 600 formed on the concavo-convex pattern 175 as a barrier wall. The organic passivation layers 170 of the peripheral areas can be removed by etching.

Figure 6E:
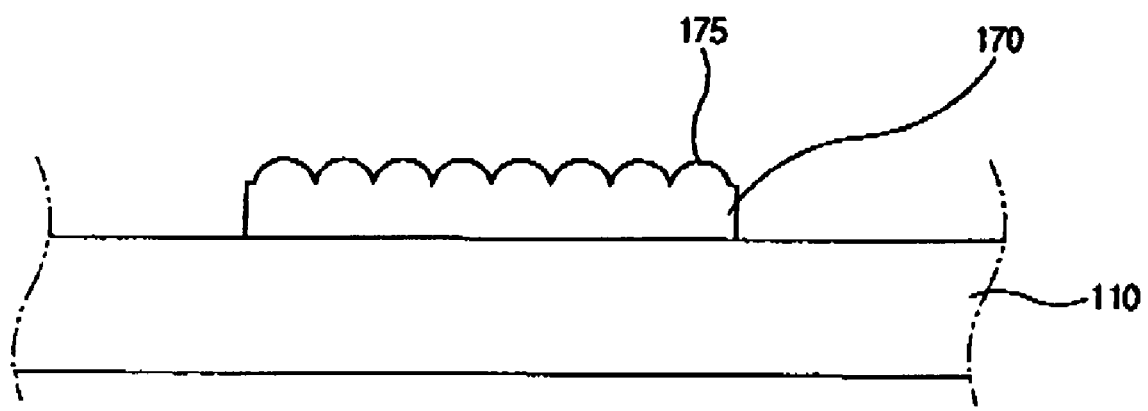

Finally, as shown in FIG. 6E, by removing the photosensitive layer 600 on the concavo-convex pattern 175, a high-quality concavo-convex pattern 175 is formed. The photosensitive layer 600 formed on the concavo-convex pattern 175 can be removed by ashing or stripping.

As described above, the present invention makes it possible to enhance the yield and reflection efficiency of the concavo-convex pattern and simplify a manufacturing method of the transflective liquid crystal display.

The invention is not limited to the embodiments described and shown and a plurality of modifications and combinations of details from the different embodiments are possible within the scope of the claims. The invention can be used to make at least one of an organic light emitting diode, a flat panel display, and an electro phoretic indication display.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A method of manufacturing a display device comprising:
   preparing an insulating substrate by:
   (a) manufacturing a plurality of insulating substrates from a mother substrate, the mother substrate having a plurality of substrate portions separated by a plurality of peripheral portions, wherein the plurality of substrate portions are used as the plurality of insulating substrates;
   (b) forming a passivation layer removing portion in a mold, wherein the passivation layer removing portion of the mold is pressed toward the peripheral portion of the mother substrate;
   forming a gate line and a data line on the insulating substrate, the gate line and the data line extending in directions that are perpendicular to each other while remaining insulated from each other, the gate line and the data line disposed at a pixel area;
   forming a thin film transistor at an intersection of the gate line and the data line;
   forming an organic passivation layer on the thin film transistor;
   positioning the mold having a concavo-convex pattern such that the concavo-convex pattern is aligned with the pixel area on the organic passivation layer;
   pressing the mold against the organic passivation layer to form the concavo-convex pattern on the surface of the organic passivation layer; and
   forming a pixel electrode on the concavo-convex pattern of the organic passivation layer.

2. The method according to claim 1, further comprising:
   removing the mold and removing the organic passivation layer where the concavo-convex pattern is not formed.

3. The method according to claim 2, wherein the removing of the organic passivation layer is performed by a light exposure process using a mask, and the mask has an opening that is aligned with the pixel area.

4. The method according to claim 1, further comprising:
   forming a reflective layer on at least a part of the pixel electrode.

5. The method according to claim 1, wherein the organic passivation layer has a viscosity of 10,000 cp or more.

6. The method according to claim 1, wherein the organic passivation layer has a viscosity of 1 cp to 100 cp.

7. The method according to claim 1, wherein the mold is made of a transparent material that transmits ultraviolet radiation.

8. The method according to claim 7, wherein the mold is made of polydimethylsiloxane (PDMS).

9. The method according to claim 7, further comprising:
   hardening the organic passivation layer while pressing the mold against the organic passivation layer.

10. The method according to claim 9, wherein the passivation layer removing portion comes in contact with the insulating substrate at the end thereof when pressuring the mold.

11. The method of claim 10, wherein the display device comprises at least one of a liquid crystal display, an organic light emitting diode, a flat panel display, and an electrophoretic indication display.

12. The method according to claim 7, further comprising:
    after removing the mold, removing organic passivation layer remaining on the peripheral portions.

13. The method according to claim 1, further comprising:
    removing the mold;
    forming a photosensitive layer on an entire surface of the organic passivation layer with the concavo-convex pattern; and
    removing the photosensitive layer where the concavo-convex pattern is not formed.

14. The method according to claim 13, wherein the removing of the photosensitive layer is performed by a light-exposure process using a mask, wherein the mask has an opening that is positioned to align with the pixel area of the organic passivation layer.

15. The method according to claim 13, further comprising:
    removing the organic passivation layer where the photosensitive layer is not formed.

16. The method according to claim 13, further comprising:
    removing the photosensitive layer formed on the concavo-convex pattern.

17. The method according to claim 1, further comprising:
    removing the mold;
    irradiating the organic passivation payer, and;
    developing the organic passivation layer to form a contact hole connecting the pixel electrode to the thin film transistor.

* * * * *